United States Patent
Brock et al.

(10) Patent No.: US 6,998,835 B1
(45) Date of Patent: *Feb. 14, 2006

(54) ELECTROMAGNETIC SENSOR SYSTEM AND METHOD

(75) Inventors: David W. Brock, San Diego, CA (US); Narayan R. Joshi, Beaumont, TX (US); Stephen D. Russell, San Diego, CA (US); Markham E. Lasher, San Diego, CA (US); Shannon D. Kasa, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 119 days.

This patent is subject to a terminal disclaimer.

(21) Appl. No.: 10/302,321

(22) Filed: Nov. 20, 2002

(51) Int. Cl.
*G01R 23/16* (2006.01)
*G01N 29/00* (2006.01)

(52) U.S. Cl. ............................ 324/76.21; 324/76.13; 73/587

(58) Field of Classification Search ............ 324/76.13, 324/76.21, 76.49, 727, 109; 340/539.1, 539.21; 250/472.1; 73/643, 601, 587
See application file for complete search history.

(56) References Cited

U.S. PATENT DOCUMENTS

| | | | |
|---|---|---|---|
| 4,028,933 A * | 6/1977 | Lemons et al. ............... | 73/627 |
| 4,103,340 A | 7/1978 | Fayling ........................ | 365/97 |
| 4,432,369 A | 2/1984 | Halvorsen .................... | 600/409 |
| 4,613,758 A * | 9/1986 | Ing et al. .................. | 250/474.1 |
| 4,622,543 A * | 11/1986 | Anderson et al. ......... | 340/572.1 |
| 5,006,797 A | 4/1991 | Smith .......................... | 324/173 |
| 5,029,291 A | 7/1991 | Zhou et al. .................. | 340/551 |
| 5,576,627 A | 11/1996 | McEwan ..................... | 340/639 |
| 5,871,681 A | 2/1999 | Karino et al. ........... | 264/272.15 |
| 6,567,688 B1 * | 5/2003 | Wang .......................... | 600/430 |
| 6,823,736 B1 * | 11/2004 | Brock et al. .................. | 73/587 |

* cited by examiner

*Primary Examiner*—Vincent Q. Nguyen
(74) *Attorney, Agent, or Firm*—Allan Y. Lee; Michael A. Kagan; Peter A. Lipovsky

(57) ABSTRACT

An electromagnetic sensor system. The system includes an electromagnetic excitable structure that generates an acoustic signal when irradiated with electromagnetic energy; an acoustic energy transducer sensor for generating a first output signal that represents the acoustic signal in response to the acoustic energy transducer detecting the acoustic signal; and a processor for determining whether the electromagnetic excitable structure is being irradiated by the electromagnetic energy in response to the processor receiving the first output signal.

18 Claims, 4 Drawing Sheets

ELECTROMAGNETIC SENSOR SYSTEM AND METHOD

BACKGROUND OF THE INVENTION

The determination of the presence and magnitude of electromagnetic radiation or whether an object of interest is being irradiated by electromagnetic radiation generally requires an absorbing sensor and electronic circuitry that is coupled to the object being considered. Typically, most systems for detecting electromagnetic radiation require that there be some defined relation between the dimensions of the sensor and the wavelength of the electromagnetic energy that is desired to be detected. However, there are some applications where it would be inconvenient to couple the sensor and electronic circuitry to the object. For example, for electromagnetic energy propagating inside radio frequency ("RF") waveguides in a radar or communication system, a "T-shaped" waveguide must be inserted to extract a portion of the electromagnetic radiation to an absorbing sensor. Such a sensor and method are intrusive and not amenable with system maintenance or non-invasive in-situ performance monitoring. Alternative conventional techniques further require wire penetration through the RF waveguide to a sensor. Therefore, a need exists for a system and method for determining the presence and magnitude of electromagnetic radiation or whether an object is being irradiated by electromagnetic energy that does not require intrusion of the sensor within the propagating medium such as a waveguide.

SUMMARY OF THE INVENTION

An electromagnetic sensor system comprises an electromagnetic excitable structure that generates an acoustic signal when irradiated with electromagnetic energy; an acoustic energy transducer sensor for generating a first output signal that represents the acoustic signal in response to the acoustic energy transducer detecting the acoustic signal; and a processor for determining whether the electromagnetic excitable structure is being irradiated by the electromagnetic energy in response to the processor receiving the first output signal.

BRIEF DESCRIPTION OF THE DRAWINGS

Throughout the several views, like elements are referenced using like references.

DESCRIPTION OF THE PREFERRED EMBODIMENT

Figure 1:
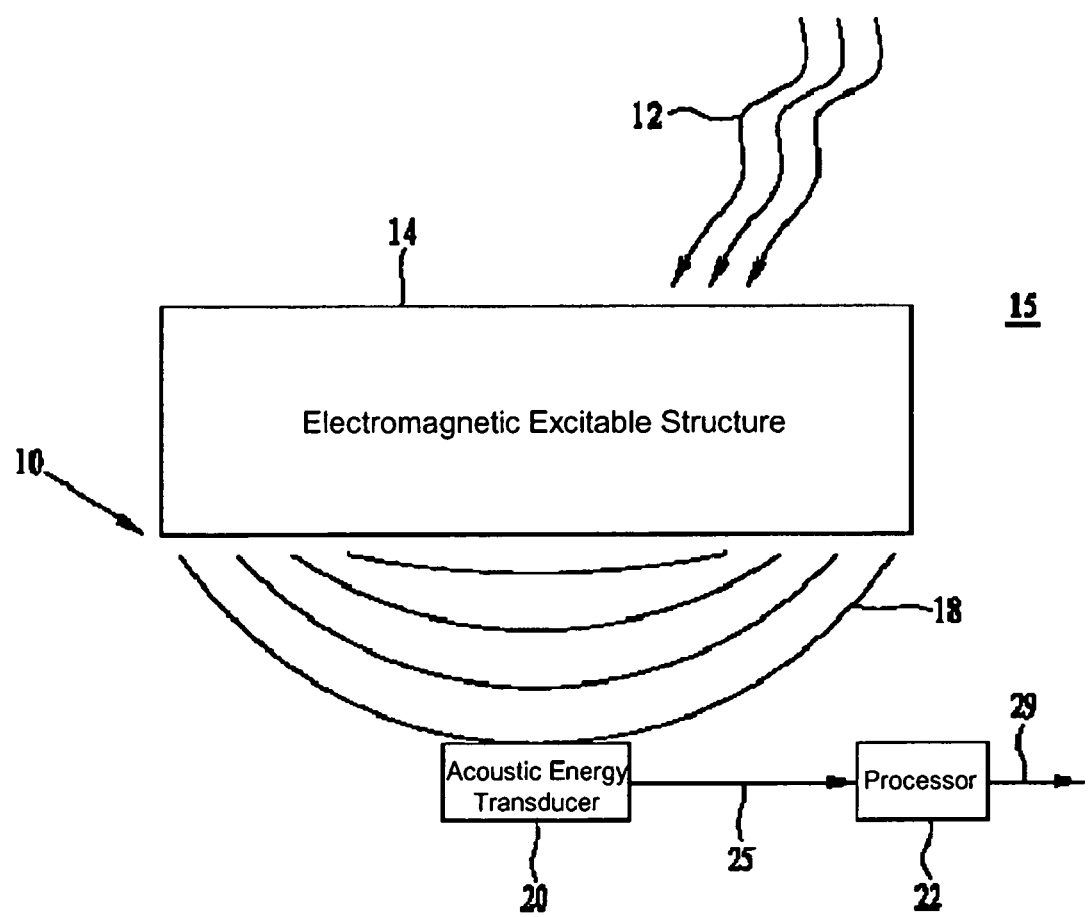
FIG. 1 shows an embodiment of an electromagnetic sensor system.

Referring to FIG. 1 there is shown an embodiment of an electromagnetic sensor system 10 for detecting electromagnetic energy 12 that may be in the microwave or radio frequency region of the electromagnetic spectrum (100 kHz to 100 Ghz), and which may be pulsed or continuous. Electromagnetic sensor system 10 includes an electromagnetic excitable structure 14, an acoustic energy transducer 20, and a processor 22. Electromagnetic excitable structure 14 is a structure that resonates at acoustic wavelengths and thereby generates an acoustic energy signal 18 in response to being irradiated by electromagnetic radiation 12. By way of example, the electromagnetic excitable structure may be implemented as a metallic structure such as an RF waveguide, which may be made of aluminum or other types of metal and metal alloys. Typically, acoustic energy transducer operating wavelengths are in the range of about 1 kHz to 1000 kHz. However, it is to be understood that acoustic energy transducer 20 may be implemented for detecting wavelengths outside of the above stated range. Sources of electromagnetic energy include magnetrons, traveling wave tubes, klystrons, solid-state devices, or other devices that generate electromagnetic radiation or waves.

Figure 2:
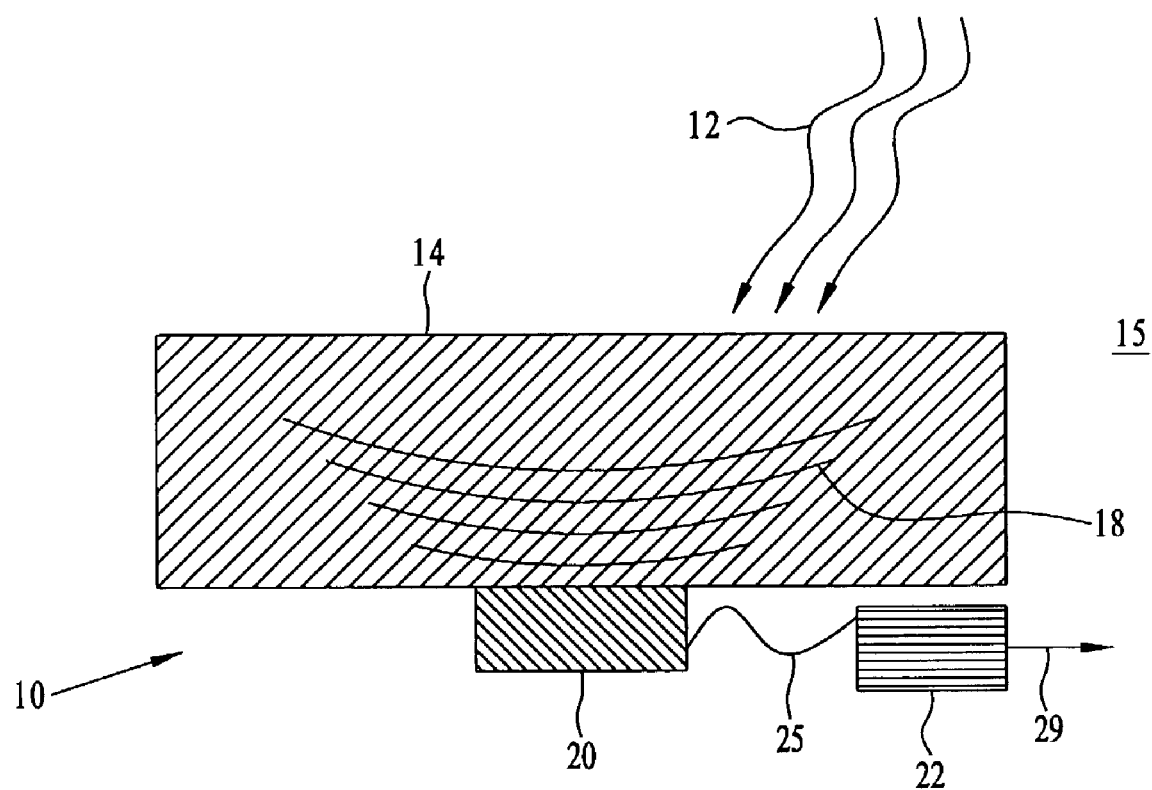
FIG. 2 shows another embodiment of an electromagnetic sensor system.

Still referring to FIG. 1, acoustic energy transducer 20 may be positioned remotely from electromagnetic excitable structure 14 so that as acoustic energy signal 18 propagates through an acoustic propagating medium (or couplant) 15, such as air, grease, or water, signal 18 is detected by acoustic energy transducer 20. In another embodiment, the acoustic energy transducer 20 may be mounted directly onto electromagnetic excitable structure 14, as shown in FIG. 2. In response to detecting acoustic energy signal 18, acoustic energy transducer 20 generates a first output signal 25 that represents the waveform of the acoustic energy signal 18. Then, in response to receiving the first output signal 25, a processor 22 determines whether electromagnetic excitable structure 14 is being irradiated with electromagnetic radiation 12. Processor 22 may provide a second output signal 29 to a display device (not shown), such as a monitor, strip chart recorder, and the like, that represents such a determination. Alternatively, output signal 29 may be used as an input signal to another device (not shown). By way of example, processor 22 may be implemented as a personal computer (PC), microprocessor, analog processor, and the like.

By way of example, acoustic energy transducer 20 may be a piezoelectric transducer such as Physical Acoustics model R50, R80, S9208 or Digital Wave Corporation model B1025. The frequency response of these sensors is: 100 to 700 kHz; 200 to 1000 kHz; 20 to 1000 kHz; and 1 to 1.5 kHz, respectively. However, it is to be understood that electromagnetic sensor system 10 may employ acoustic energy transducers having a detection sensitivity anywhere in the range 1 kHz to 1000 kHz. The voltage output signal 25 from acoustic energy transducer 20 may be subjected to suitable signal processing, such as amplification and/or filtering by signal conditioning circuit (not shown) before being input into processor 22.

In general, processor 22 may implement any of several well known mathematical techniques using suitable software routines for determining whether electromagnetic excitable structure 14 is being irradiated with electromagnetic energy 12. For example, a software program such as the Integrated Condition Assessment System (ICAS) by the IDAX Corporation may be used for scaling or normalizing data, performing trend analysis, and the like.

One example of a mathematical technique that may be implemented by processor 22 is the integration of values representing the waveform of signal 25 over a period of time, where signal 25 represents the waveform of acoustic energy signal 18. Sufficient deviations between the integrated values obtained from signal 25 and a set of reference values may be used to determine whether electromagnetic excitable structure 14 is being irradiated with electromagnetic energy 12. In another embodiment, processor 22 may be employed to implement a suitable software routine that identifies and compares the maximum amplitude of signal 25 with the maximum amplitude of a reference value that corresponds to electromagnetic excitable structure 14 being irradiated by electromagnetic radiation 12. The reference value is typically greater than the background noise level that would be present in signal 25 when electromagnetic excitable structure 14 is not being irradiated by electromagnetic radiation 12. For example, if the maximum amplitude of signal 25 exceeds such a reference value, then processor 22 determines that electromagnetic excitable structure 14 is being irradiated by electromagnetic radiation 12. If the maximum amplitude of signal 25 is less than such a reference value, then processor 22 determines that electromagnetic excitable structure 14 is not being irradiated by electromagnetic radiation 12.

Another example of a mathematical technique for determining whether electromagnetic excitable structure 14 is being irradiated with electromagnetic radiation 12 is a fast Fourier transform (FFT) of a representation of the waveform of signal 25, and hence the waveform characteristics of acoustic energy signal 18. The FFT analysis performed by processor 22 may be used to identify frequency components in output signal 25 that are characteristic of irradiation of electromagnetic excitable structure 14 being irradiated by electromagnetic energy 12. The FFT analysis performed by processor 22 may also be used to identify the the source of electromagnetic radiation 12 by the frequency components in signal 25, where such frequency components are known to be characteristic of a particular source (not shown) of electromagnetic energy 12.

Examples of suitable acoustic energy transducers include piezoelectric devices, surface acoustic wave devices, microelectro mechanical systems (MEMS), and any other type of transducer that generates an output signal representing the waveform of a detected acoustic energy signal.

Figure 3:
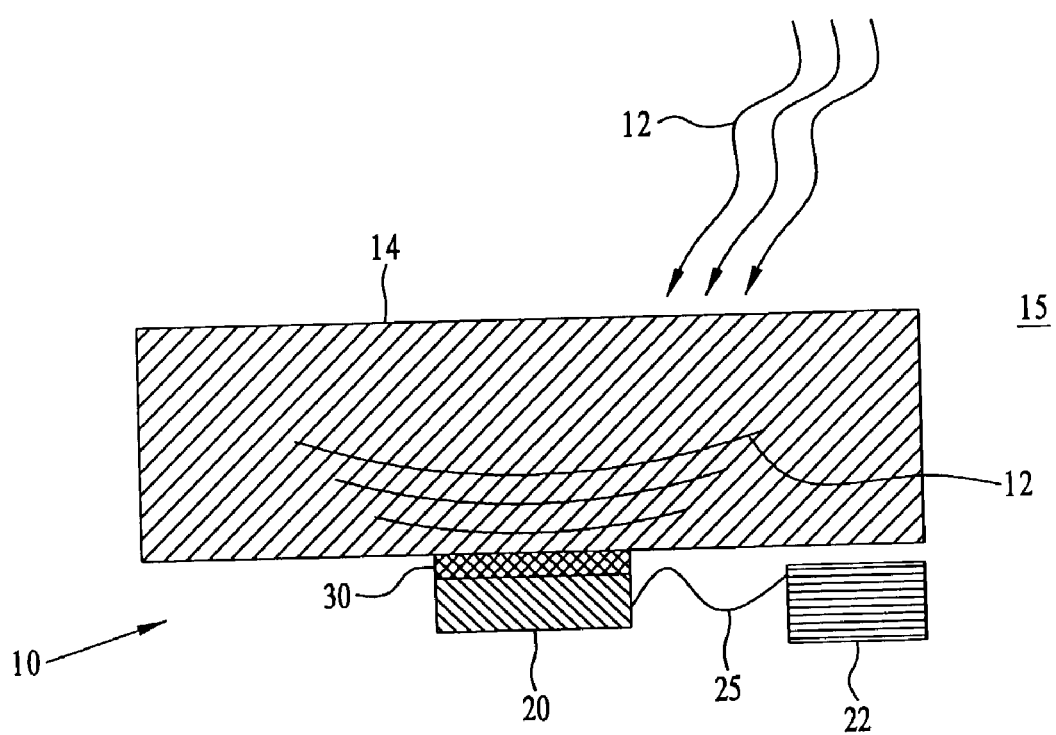
FIG. 3 shows an embodiment of an electromagnetic sensor system wherein an acoustic couplant is interposed between the acoustic transducer and the electromagnetic excitable structure.

Another embodiment of electromagnetic sensor system 10 is shown in FIG. 3 to further include an acoustic couplant layer 30 interposed between the electromagnetic excitable structure 14 and the acoustic energy transducer 20. Acoustic couplant layer 30 enhances the acoustic coupling between the electromagnetic excitable structure 14 and the acoustic energy transducer 20 to improve the signal to noise ratio of output signal 25. Acoustic couplant layer 30 may be implemented as a silicone grease, acoustically conductive epoxies, and the like.

Figure 4:
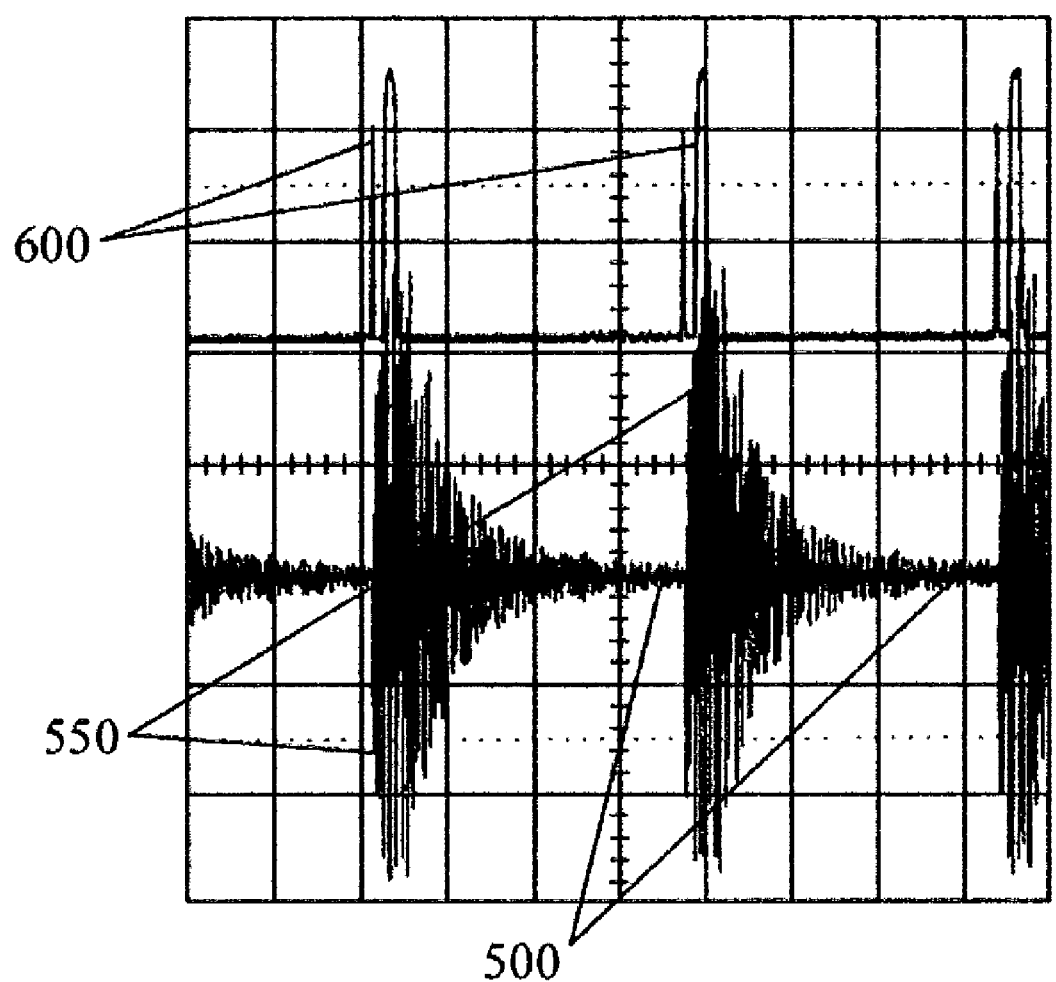
FIG. 4 shows an oscilloscope trace of the output of acoustic energy transducer when the electromagnetic excitable sensor is being irradiated with electromagnetic energy and when it is not being so irradiated.

FIG. 4 shows an example of a signal 25 generated in an electromagnetic sensor system 10 wherein an R50 type of acoustic energy transducer 20 having a frequency range of 100 Khz to 700 kHz was affixed to a metallic RF waveguide using layer of General Electric MIL-S-8660B silicone grease having a thickness of less than 0.1 about mm. The silicone grease provided acoustic couplant layer 30 between acoustic energy transducer 20 and the metallic RF waveguide. The metallic RF waveguide served as electromagnetic excitable structure 14. Signal 25 was connected to processor 22 through a Physical Acoustics Model 2/4/6 pre-amplifier and Physical Acoustics Model AE1A amplifier to a LeCroy Model 9354AM digital oscilloscope which served as a display device. Position 500 represents the amplitude of first output signal 25 when no electromagnetic radiation was passing through the RF waveguide. Position 550 shows the amplitude of voltage signal 25 when electromagnetic energy propagates through the RF wave-guide. As may be seen in FIG. 3, the oscilloscope clearly indicates whether electromagnetic radiation is propagating through the RF waveguide.

Obviously, many modifications and variations of the invention are possible in light of the above teachings. It is therefore to be understood that within the scope of the appended claims, the invention may be practiced otherwise than as specifically described.

We claim:

1. An electromagnetic sensor system, comprising:
an electromagnetic excitable structure that generates an acoustic signal when irradiated with pulsed or continuous electromagnetic energy;
an acoustic energy transducer sensor having a detection sensitivity in the frequency range between approximately 1 kHz and approximately 1000 kHz for generating a first output signal that represents said acoustic signal in response to said acoustic energy transducer detecting said acoustic signal; and
a processor for determining whether said electromagnetic excitable structure is being irradiated by said electromagnetic energy in response to said processor receiving said first output signal.

2. The electromagnetic sensor system of claim 1 wherein said processor generates a second output signal representing whether said electromagnetic excitable structure is being irradiated by said electromagnetic energy in response to receiving said first output signal.

3. The electromagnetic sensor system of claim 1 wherein said processor performs a fast Fourier transform of a representation of said acoustic signal for determining whether said electromagnetic excitable structure is being irradiated by said electromagnetic radiation.

4. The system of claim 3 further including generating a second output signal that represents a fast Fourier transform of a representation of said acoustic signal.

5. The electromagnetic sensor system of claim 1 wherein said processor compares a representation of said acoustic signal to a reference value for determining whether said electromagnetic excitable structure is being irradiated by said electromagnetic radiation.

6. The electromagnetic sensor system of claim 5 wherein said processor generates a second output signal that represents a comparison between a representation of said acoustic signal and a reference value for indicating whether said electromagnetic excitable structure is being irradiated by said electromagnetic radiation.

7. The system of claim 1 wherein said acoustic energy transducer is selected from the group that includes a piezoelectric transducer, surface acoustic wave device, and a micro-mechanical system.

8. The system of claim 1 wherein said electromagnetic excitable structure is a RF waveguide.

9. The system of claim 1 wherein said processor is a computer.

10. The system of claim 1 wherein said acoustic transducer is in physical contact with said electromagnetic excitable structure.

11. The system of claim 1 wherein said acoustic transducer is positioned remotely from said electromagnetic excitable structure.

12. A method for detecting electromagnetic radiation, comprising:
generating an acoustic signal in response to an electromagnetic excitable structure being irradiated with pulsed or continuous electromagnetic energy;

receiving said acoustic signal using an acoustic energy transducer sensor having a detection sensitivity in the frequency range between approximately 1 kHz and approximately 1000 kHz;

transforming said acoustic signal into a first signal which is an analog of said electromagnetic energy; and determining whether said electromagnetic excitable structure is being irradiated by said electromagnetic radiation.

13. The method of claim 12 further including the step of generating a second output signal that represents whether said electromagnetic excitable structure is being irradiated by said electromagnetic energy in response to receiving said first output signal.

14. The method of claim 12 wherein said step for determining whether said electromagnetic excitable structure is being irradiated by said electromagnetic radiation includes performing a fast Fourier transform of a representation of said acoustic signal.

15. The method of claim 14 further including the step of generating a second output signal that represents said fast Fourier transform of a representation of said acoustic signal.

16. The method of claim 12 wherein said step for determining whether said electromagnetic excitable structure is being irradiated by said electromagnetic radiation includes comparing a representation of said acoustic signal to a reference value.

17. The method of claim 16 further includes generating a second output signal that represents a comparison between a representation of said acoustic signal and a reference value for indicating whether said electromagnetic excitable structure is being irradiated by said electromagnetic radiation.

18. An electromagnetic sensor system, comprising:

an electromagnetic excitable structure that generates an acoustic signal when irradiated with pulsed or continuous electromagnetic energy;

an acoustic energy transducer sensor having a detection sensitivity in the frequency range between approximately 1 kHz and approximately 1000 kHz for generating a first output signal that represents said acoustic signal in response to said acoustic energy transducer detecting said acoustic signal;

an acoustic couplant layer interposed between said electromagnetic excitable structure and said acoustic energy transducer; and a processor for determining whether said electromagnetic excitable structure is being irradiated by said electromagnetic energy in response to, said processor receiving said first output signal.

* * * * *